US009530883B2

(12) United States Patent
Deng et al.

(10) Patent No.: US 9,530,883 B2
(45) Date of Patent: Dec. 27, 2016

(54) INSULATED GATE SEMICONDUCTOR DEVICE HAVING A SHIELD ELECTRODE STRUCTURE AND METHOD

(71) Applicant: Semiconductor Components Industries, LLC, Phoenix, AZ (US)

(72) Inventors: Shengling Deng, Chandler, AZ (US); Zia Hossain, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/992,106

(22) Filed: Jan. 11, 2016

(65) Prior Publication Data

US 2016/0126348 A1    May 5, 2016

Related U.S. Application Data

(63) Continuation of application No. 14/336,770, filed on Jul. 21, 2014, now Pat. No. 9,269,779.

(51) Int. Cl.
*H01L 29/66* (2006.01)
*H01L 29/78* (2006.01)
(Continued)

(52) U.S. Cl.
CPC ......... *H01L 29/7813* (2013.01); *H01L 29/063* (2013.01); *H01L 29/1095* (2013.01);
(Continued)

(58) Field of Classification Search
CPC ............... H01L 29/7813; H01L 29/407; H01L 29/66734; H01L 29/41766; H01L 29/4236; H01L 29/7827; H01L 29/66666; H01L 29/66348; H01L 29/1095; H01L 29/063
See application file for complete search history.

(56) References Cited

U.S. PATENT DOCUMENTS 5,973,360 A    10/1999  Tihanyi
5,998,833 A    12/1999  Baliga
(Continued)

FOREIGN PATENT DOCUMENTS

DE    102006036347 A1    4/2008

OTHER PUBLICATIONS

German Patent and Trademark Office, Examiner's Report, Apr. 14, 2016—11 pages.

(Continued)

*Primary Examiner* — Michael Trinh
(74) *Attorney, Agent, or Firm* — Kevin B. Jackson

(57) ABSTRACT

A semiconductor device includes a semiconductor region with a charge balance region on a junction blocking region, which has a lower doping concentration. A trench structure having an insulated shield electrode and an insulated gate electrode is provided in the semiconductor region. The semiconductor device further includes one or more features configured to improve operating performance. The features include terminating the trench structure in the junction blocking region, providing a localized doped region adjoining a lower surface of a body region and spaced apart from the trench structure, disposing a notch proximate to the lower surface of the body region, and/or configuring the insulated shield electrode to have a wide portion adjoining a narrow portion.

20 Claims, 11 Drawing Sheets

(51) Int. Cl.
    *H01L 29/10*     (2006.01)
    *H01L 29/40*     (2006.01)
    *H01L 29/423*     (2006.01)
    *H01L 29/06*     (2006.01)
    *H01L 29/417*     (2006.01)

(52) U.S. Cl.
    CPC ........ *H01L 29/407* (2013.01); *H01L 29/4236* (2013.01); *H01L 29/66666* (2013.01); *H01L 29/66734* (2013.01); *H01L 29/41766* (2013.01)

(56) References Cited

U.S. PATENT DOCUMENTS

| | | | |
|---|---|---|---|
| 6,144,054 | A | 11/2000 | Agahi |
| 6,147,377 | A | 11/2000 | Liu |
| 6,365,462 | B2 | 4/2002 | Baliga |
| 7,344,943 | B2 | 3/2008 | Herrick et al. |
| 7,361,539 | B2 | 4/2008 | Chen et al. |
| 7,452,777 | B2 | 11/2008 | Kocon et al. |
| 7,485,544 | B2 | 2/2009 | Forbes et al. |
| 7,504,306 | B2 | 3/2009 | Sapp et al. |
| 7,525,162 | B2 | 4/2009 | Yin et al. |
| 7,585,720 | B2 | 9/2009 | Sudo |
| 7,741,185 | B2 | 6/2010 | Tanabe |
| 7,767,540 | B2 | 8/2010 | Peidous et al. |
| 8,076,719 | B2 * | 12/2011 | Zeng ................ H01L 29/0634 257/330 |
| 8,404,295 | B2 * | 3/2013 | Pires ................ A23C 9/1223 426/478 |
| 2004/0232410 | A9 | 11/2004 | Dahmani et al. |
| 2005/0093030 | A1 | 5/2005 | Doris et al. |
| 2007/0126055 | A1 | 6/2007 | Hueting et al. |
| 2008/0017920 | A1 | 1/2008 | Sapp |
| 2008/0042172 | A1 * | 2/2008 | Hirler ................ H01L 29/0623 257/288 |
| 2008/0070365 | A1 | 3/2008 | Park |
| 2009/0014807 | A1 | 1/2009 | Tang et al. |
| 2009/0050959 | A1 | 2/2009 | Madson |
| 2009/0079011 | A1 | 3/2009 | Chidambarrao et al. |
| 2009/0194811 | A1 | 8/2009 | Pan et al. |
| 2010/0171171 | A1 | 7/2010 | Hsu et al. |
| 2010/0187602 | A1 | 7/2010 | Woolsey |
| 2011/0136309 | A1 | 6/2011 | Grivna et al. |
| 2011/0136310 | A1 | 6/2011 | Grivna |
| 2011/0169103 | A1 | 7/2011 | Darwish et al. |
| 2012/0064684 | A1 * | 3/2012 | Hsieh ................ H01L 29/0634 438/270 |
| 2012/0319199 | A1 | 12/2012 | Zeng et al. |
| 2012/0326227 | A1 | 12/2012 | Burke et al. |
| 2013/0240987 | A1 | 9/2013 | Hirler |
| 2013/0248982 | A1 | 9/2013 | Grivna et al. |
| 2013/0323921 | A1 | 12/2013 | Burke et al. |
| 2014/0054682 | A1 * | 2/2014 | Padmanabhan ....... H01L 29/404 257/330 |
| 2014/0054691 | A1 | 2/2014 | Yilmaz |
| 2014/0284710 | A1 * | 9/2014 | Hossain ................ H01L 29/36 257/330 |
| 2015/0162411 | A1 | 6/2015 | Schulze et al. |

OTHER PUBLICATIONS

P. Moens et al., Stress-Induced Mobility Enhancement for Integrated Power Transistors, IEEE, IEDM 2007, pp. 877-880, Dec. 2007.

Qi Wang et al., Enhanced Electrical and Thermal Properties of Trench Metal-Oxide-Semiconductor Field-Effect Transistor Built on Copper Substrate, IEEE Electron Device Letters, vol. 30, No. 1, Jan. 2009.

Anonymous, Trench PowerFET with Improved Switching Performance, www.ip.com; IP.com number: IPCOM000161992D, Dec. 12, 2007.

German Patent and Trademark Office, Search Report, dated Apr. 12, 2016.

* cited by examiner

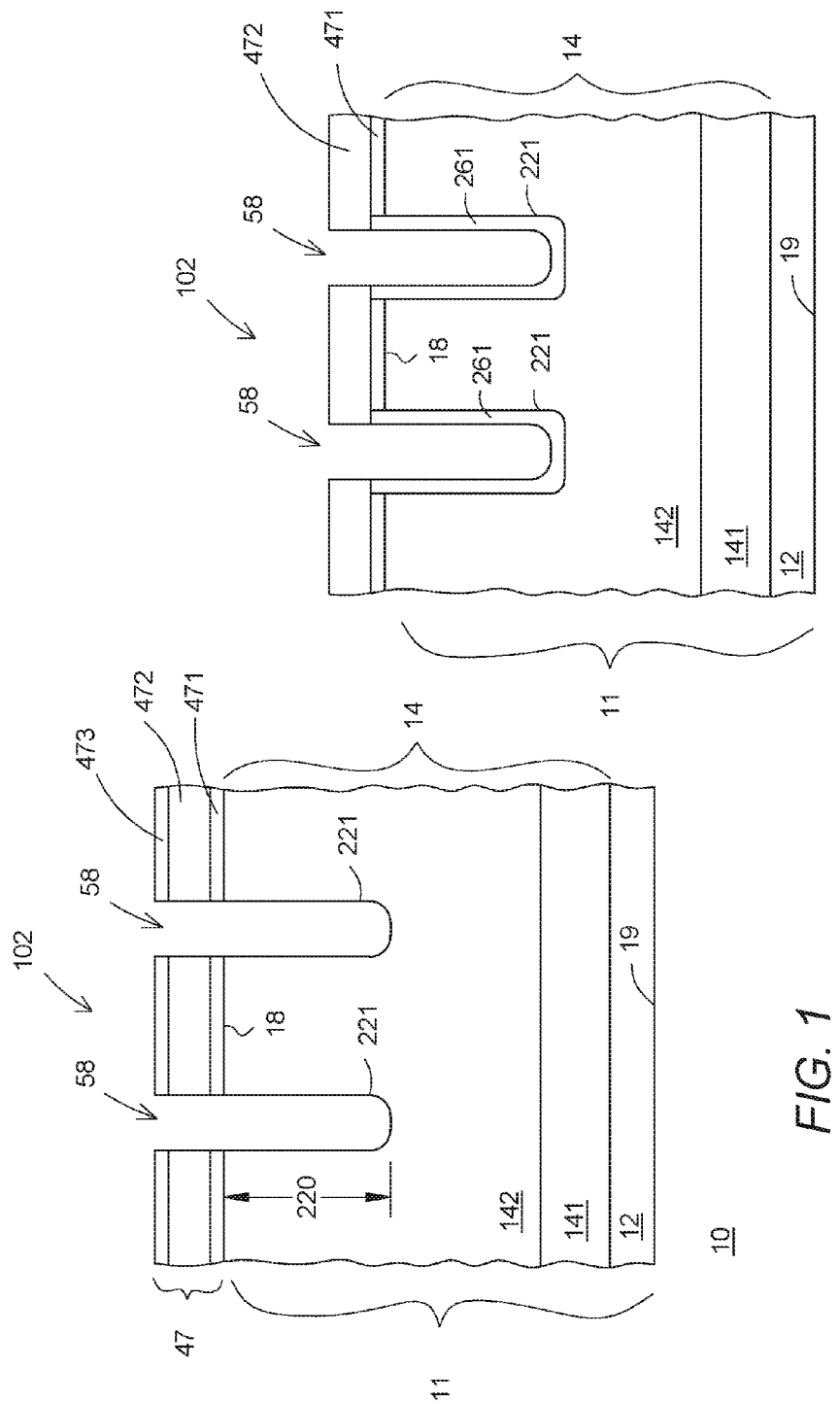

INSULATED GATE SEMICONDUCTOR DEVICE HAVING A SHIELD ELECTRODE STRUCTURE AND METHOD

CROSS-REFERENCE TO RELATED APPLICATIONS

The present application is a continuation application of co-pending U.S. patent application Ser. No. 14/336,770, filed on Jul. 21, 2014, U.S. Pat. No. 9,269,779, which is hereby incorporated by reference, and priority thereto is hereby claimed.

BACKGROUND

This document relates generally to semiconductor devices and, more specifically, to methods of forming insulated gate devices and structures.

Insulated gate field effect transistors (IGFETs), such as metal oxide semiconductor field effect transistors (MOSFETs), have been used in many power switching applications, such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

There is a class of MOSFET devices in which the gate electrode is formed in a trench extending downward from a major surface of a semiconductor material, such as silicon. Current flow in this class of devices is primarily in a vertical direction through the device, and, as a result, device cells can be more densely packed. All else being equal, the more densely packed device cells can increase the current carrying capability and reduce on-resistance of the device.

Medium and high voltage Trench MOSFET devices used in high frequency switch mode power supply (SMPS) applications should exhibit low small-signal output capacitance ($C_{OSS}$) and low on-resistance ($R_{dson}$) to meet desired switching efficiency. Also, the low $R_{dson}$ should be balanced with maintaining desired breakdown voltage ($BV_{DSS}$) and achieving desired ruggedness, such as good unclamped inductive switching (UIS). In the past, achieving low $C_{OSS}$ was difficult in medium voltage MOSFET devices (for example, about 40 volts to about 150 volts) because $BV_{DSS}$ is proportional to trench depth and $C_{OSS}$ is also proportional to trench depth (i.e., increases with trench depth). Various techniques have been used in an attempt to lower $C_{OSS}$. In one technique, a thick shield electrode liner oxide and/or thick bottom oxide has been used; however, this technique resulted in higher $R_{dson}$ and exhibited process yield issues. In another technique, a high resistive drift region was used; however, this technique also resulted in higher $R_{dson}$. In a further technique, a high energy ion implant was used to place dopant very deep into the drift region and spaced apart from the body region; however this technique required very expensive ion implantation equipment, suffered from process repeatability issues, and suffered from process yield issues.

Accordingly, it is desirable to have a method and structure that reduces small signal output capacitance, reduces on-resistance, improves switching characteristics, reasonably maintains $BV_{DSS}$ performance, reduces hot-carrier induced $BV_{DSS}$ walk-in/out, and improves device ruggedness. Also, it is desirable that the method and structure be compatible with existing process flows, avoid having to use expensive process equipment, and have improved process repeatability and yields.

BRIEF DESCRIPTION OF THE DRAWINGS

FIGS. 1-10 illustrate partial cross-sectional views of a semiconductor device at various stages of fabrication in accordance with a first embodiment of the present invention;

Figure 3:
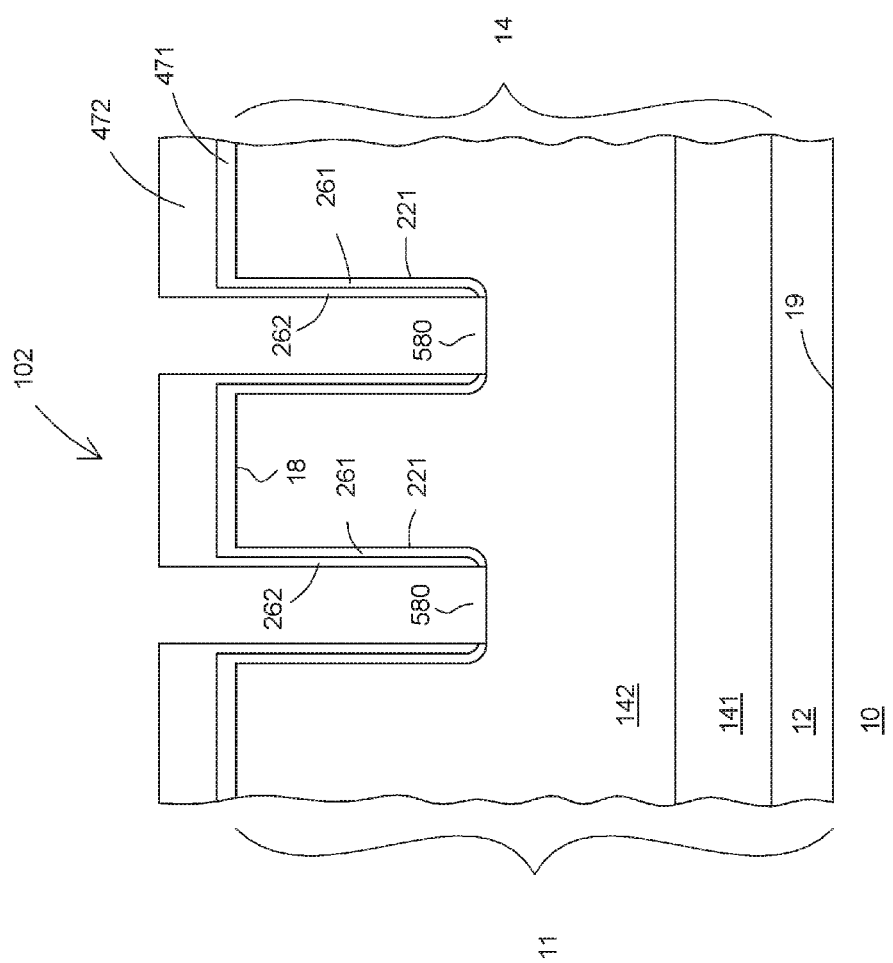

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-channel devices, a person of ordinary skill in the art understands that P-channel devices and complementary devices are also possible in accordance with the present description. For clarity of the drawings, doped regions of device structures can be illustrated as having generally straight-line edges and precise angular corners; however, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description can embody either a cellular-base design (in which the body regions are a plurality of distinct and separate cellular or stripe regions) or a single-base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular-base design and a single-base design.

DETAILED DESCRIPTION OF THE DRAWINGS

In general, the present embodiments relate to an insulated gate semiconductor device and a method of manufacture. In one embodiment, the device can include a semiconductor substrate, a first layer of a first dopant concentration on the semiconductor substrate, a second layer of a second dopant concentration on the first layer, an insulated trench gate electrode, and an insulated trench shield electrode. In some embodiments, the second dopant concentration is greater than the first dopant concentration, which provides for a reduction in trench depth to improve $C_{OSS}$ performance In some embodiments, the trench structure includes a notch or indentation proximate to a body region of the device. The notch can be configured to reduce electric field build-up and increase $BV_{DSS}$ performance In other embodiments, the device can include a localized doped region or regions adjacent a lower surface of the body region but spaced apart from the trench structure where the doped region has an opposite conductivity type to the second semiconductor layer. The doped region can be configured to enhance UIS performance, reduce electric-field build-up and increase $BV_{DSS}$ performance, and lower capacitance. In other embodiments, the shield electrode can have a wide portion and a narrow portion configured to lower $R_{dson}$, improve $BV_{DSS}$ and UIS performance, and reduce capacitance. In other embodiments, the device can include a doped region adjacent the body region of the device and trench structure where the body region has the same conductivity type as the second semiconductor layer but a higher dopant concentration. In some embodiments, the device can include all of the described features. In some embodiments, the device can include at least one of the described features. In other embodiments, the device can include at least two of the described features. In further embodiments, the device can include at least three of the described features. In still further embodiments, the device can include at least four of the described features.

FIG. 1 illustrates a partial cross-sectional view of a semiconductor device 10 or cell 10 at an early stage of fabrication in accordance with a first embodiment. Device 10 can include a region of semiconductor material 11, semiconductor substrate 11, or semiconductor region 11, which can include, for example, an n-type silicon substrate 12 having a resistivity ranging from about 0.001 ohm-cm to about 0.005 ohm-cm. By way of example, substrate 12 can be doped with phosphorous, arsenic, or antimony. In the embodiment illustrated, substrate 12 provides a drain region, drain contact, or a first current carrying contact for device 10. In this embodiment, device 10 can be formed in an active area 102 of a semiconductor chip. Also, in this embodiment, device 10 can be configured as a vertical power MOSFET structure, but this description applies as well to insulated gate bipolar transistors (IGBT), MOS-gated thyristors, and other related or equivalent structures as known by one of ordinary skill in the relevant art.

In accordance with the present embodiment, a multi-region semiconductor layer 14, multi-layer drift region 14, or multi-layer extended drain region 14 can be formed in, on, or overlying substrate 12. In some embodiments, multi-region semiconductor layer 14 can include a charge balance region 142 or charge balance layer 142 and a junction blocking region 141 or a junction blocking layer 141 between substrate 12 and charge balance region 142. In accordance with the present embodiment, charge balance region 142 has a higher dopant concentration than junction blocking region 141. In accordance with the present embodiment, multi-region semiconductor layer 14 is configured to provide a reduction in $C_{OSS}$ while supporting $BV_{DSS}$ performance for device 10 as will be described further later. In one embodiment, multi-region semiconductor layer 14 can be formed using semiconductor epitaxial growth techniques. Alternatively, multi-region semiconductor layer 14 can be formed using semiconductor doping and diffusion/annealing techniques. In other embodiments, junction blocking region 141 is formed using epitaxial growth techniques and charge balance region 142 is formed using semiconductor doping and diffusion/annealing techniques. In an embodiment suitable for a 100 volt device, charge balance region 142 can be n-type with a dopant concentration of about $2.0 \times 10^{16}$ atoms/$cm^3$ to about $4.0 \times 10^{16}$ atoms/$cm^3$ and can have a thickness from about 3.5 microns to about 4.5 microns. Junction blocking region 141 can be n-type with a dopant concentration of about $5.0 \times 10^{15}$ atoms/$cm^3$ to about $1.0 \times 10^{16}$ atoms/$cm^3$ and can have a thickness from about 4 microns to about 5 microns. In one embodiment, the dopant concentration of charge balance region 142 is at least 90% greater than the dopant concentration of junction blocking region 141. In one embodiment, the dopant concentration of charge balance region 142 is about 150% greater than the dopant concentration of junction blocking region 141. In one embodiment, the dopant concentration of charge balance region 142 is about 200% greater than the dopant concentration of junction blocking region 141. In one preferred embodiment for medium voltage devices (for example, from about 40 volts to about 150 volts), the dopant concentration of charge balance region 142 is about 250% greater than the dopant concentration of junction blocking region 141. In one embodiment, the dopant concentration of charge balance region 142 is about 300% greater than the dopant concentration of junction blocking region 141. In one embodiment, the dopant concentration of charge balance region 142 is about 500% greater than the dopant concentration of junction blocking region 141. In one preferred embodiment for medium to higher voltage devices, the dopant concentration of charge balance region 142 is about 700% greater than the dopant concentration of junction blocking region 141. In one embodiment, the dopant concentration of charge balance region 142 is about 800% greater than the dopant concentration of junction blocking region 141. In one embodiment, the dopant concentration of charge balance region 142 is about 100% to about 800% greater than the dopant concentration of junction blocking region 141. In one preferred embodiment for medium and higher voltage devices (for example, from about 40 volts to about 200 volts), the dopant concentration of charge balance region 142 is about 150% to about 750% greater than the dopant concentration of junction blocking region 141. In another preferred embodiment for medium and higher voltage devices, the dopant concentration of charge balance region 142 is about 250% to about 700% greater than the dopant concentration of junction blocking region 141.The dopant concentrations and thicknesses of charge balance region 142 and junction blocking region 141 can be increased or decreased depending, for example, on the desired $BV_{DSS}$ rating and layout design of device 10. Also, it is contemplated that other materials can be used for region of semiconductor material 11 or portions thereof including silicon-germanium, silicon-germanium-carbon, carbon-doped silicon, silicon carbide, gallium nitride, or other related or equivalent materials as known by one of ordinary skill in the art.

In some embodiments, a masking layer 47 can be formed overlying a major surface 18 of region of semiconductor material 11. Region of semiconductor material 11 can also include a major surface 19, which is opposite to major surface 18. In one embodiment, masking layer 47 can comprise a dielectric film or a film resistant to the etch chemistries used to form trench structures described hereinafter. In one embodiment, masking layer 47 can include more than one layer including, for example, a dielectric layer 471 of about 0.030 microns of thermal oxide, a dielectric layer 472 of about 0.2 microns of silicon nitride, and a dielectric layer 473 of about 0.1 microns of deposited oxide.

Openings 58 can then be formed in masking layer 47. In one embodiment, photoresist and etch processes can be used to form openings 58. In some embodiments, openings 58 can have a width of about 1.0 micron to about 1.5 microns. In some embodiments, an initial spacing between openings 58 can be about 1.2 microns to about 2.0 microns.

After openings 58 are formed, segments of multi-region semiconductor layer 14 can be removed to form trenches 221 extending from major surface 18. By way of example, trenches 221 can be etched using plasma etching techniques with a fluorocarbon chemistry or a fluorinated chemistry (for example, $SF_6/O_2$) or other chemistries or removal techniques as known to those of ordinary skill in the art. In accordance with the present embodiment, trenches 221 can form first parts or portions of trench structures, which will be designated as trench structures 22 starting in FIG. 4. In one embodiment, trenches 221 can have a depth 220 of about 1.0 microns to about 1.2 microns or different depths. In accordance with the present embodiment, trenches 221 can have a depth 220 that extends about 0.2 microns to about 0.5 microns below the depth of the body regions of device 10, which will be described later.

FIG. 2 illustrates a partial cross-sectional view of device 10 after additional processing. In an optional step, a sacrificial layer (not shown) can be formed adjoining surfaces of trenches 221. By way of example, a thermal silicon oxide layer can be formed. Next, the sacrificial layer and dielectric layer 473 can be removed using, for example, an etch process. A layer 261 of material can then be formed along surfaces of trenches 221. In one embodiment, layer 261 can be one or more dielectric or insulative materials. By way of example, layer 261 can be about a 0.1 micron wet or thermal oxide layer. Portions of multi-region semiconductor layer 14 can be consumed during the formation of layers 261. It is understood that different thicknesses for layer 261 can be used. In some embodiments layer 261 can be a deposited dielectric material or can be deposited dielectric materials.

Figure 4:
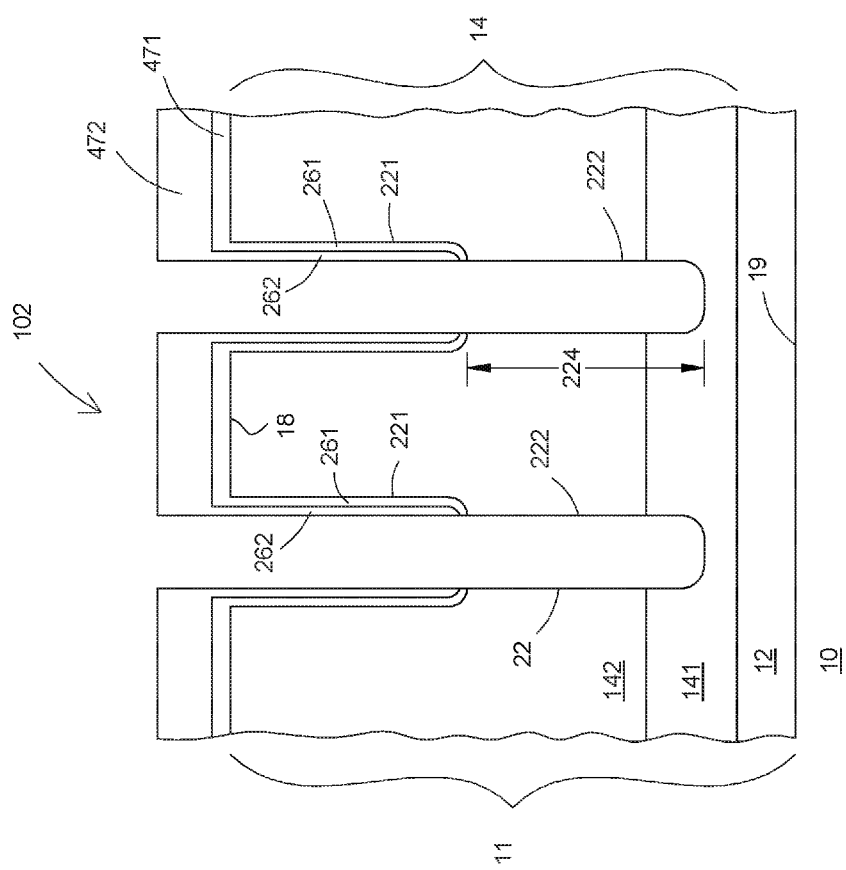

FIG. 3 illustrates a partial cross-sectional view of device 10 after further processing. A dielectric layer 262 can be formed along layer 261 and sidewalls of layers 471 and 472. In some embodiments, dielectric layer 262 can be a nitride layer, and can have a thickness of about 0.07 microns. In an alternate embodiment, a crystalline semiconductor layer, such as an undoped polysilicon layer, can be formed between layers 262 and 261. Next, an anisotropic dry etch can be used to remove portions of layers 262 and 261 from lower surfaces of trenches 221 to form openings 580, which can expose segments of multi-region semiconductor layer 14. After openings 580 are formed, segments of multi-region semiconductor layer 14 can be removed to form trenches 222 extending from trenches 221 as illustrated in FIG. 4. By way of example, trenches 222 can be etched using plasma etching techniques with a fluorocarbon chemistry or a fluorinated chemistry (for example, $SF_6/O_2$) or other chemistries or removal techniques as known to those of ordinary skill in the art. In accordance with the present embodiment, trenches 222 can form second parts or portions of trench structures or multi-part trenches 22. In one embodiment, trenches 222 can have a depth 224 of about 2.0 microns to about 3.0 microns. In one embodiment, trench structures 22 can have a cumulative depth of about 3.0 microns to about 4.2 microns. In accordance with the present embodiment, the cumulative depth of trench structures 22 can be reduced by about 50% compared to related devices, which beneficially reduces $C_{OSS}$ performance in device 10. In accordance with the present embodiment, trench structures 22 extend at least partially into junction blocking region 141. In accordance with the present embodiment, trench structures 22 can be configured as a combination of gate electrode and shield electrode trenches for device 10 formed within, for example, active area 102.

Figure 5:
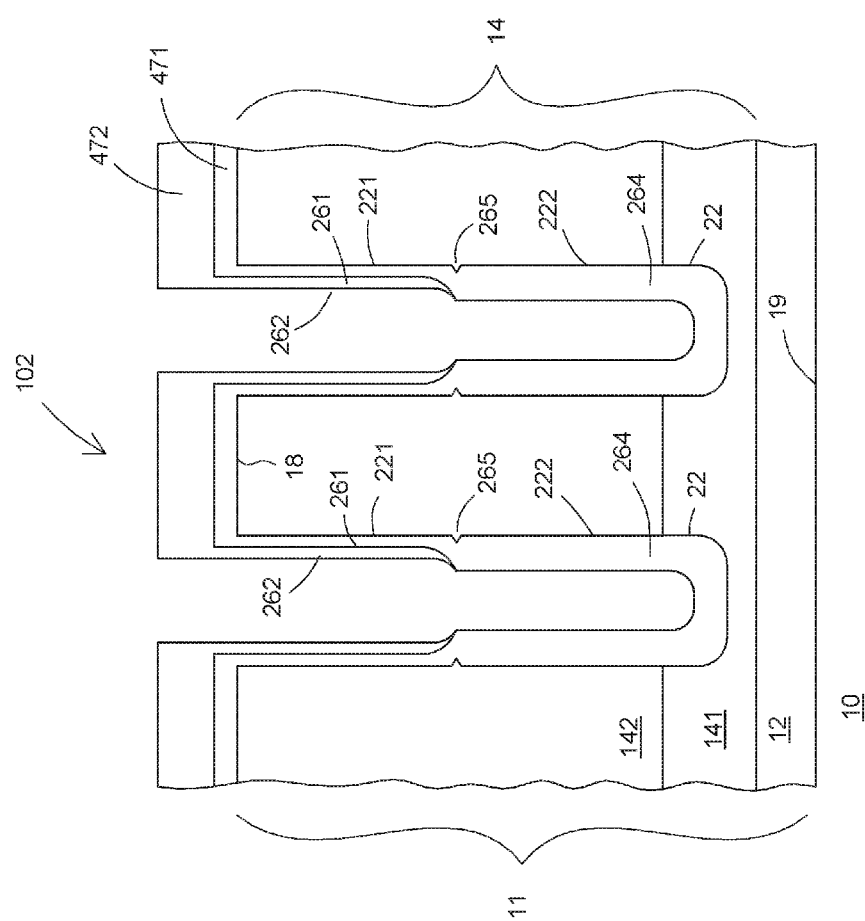

FIG. 5 illustrates a partial cross-sectional view of device 10 after additional processing. In an optional step, a sacrificial layer (not shown) can be formed adjoining surfaces of trenches 222. By way of example, a thermal silicon oxide layer of about 0.1 microns thick is formed. Next, the sacrificial layer can be removed using, for example, an etch process. Layer or layers 264 of material can then be formed along surfaces of trenches 222. In one embodiment, layers 264 can be one or more dielectric or insulative materials. By way of example, layer 264 can be about a 0.3 micron to about 0.5 micron thermal oxide layer. Portions of multi-region semiconductor layer 14 can be consumed during the formation of the thermal oxide. In one embodiment, layer 264 is thicker than layer 261. In one embodiment, layer 264 can be multiple layers of similar or different materials, such as thermal and deposited dielectric or insulative materials. In accordance with the present embodiment, due to the structural attributes of trench structures 22 resulting from the described method of formation, a notch 265, indentation 265, or channel 265 is formed in a sidewall surface of trench structures 22 proximate to or adjoining the transition from layer 261 to layer 264. Specifically, trench structures 22 includes a sidewall profile having notch 265 oriented substantially inward towards an inner portion of trench structures 22 as generally illustrated in FIG. 5, and notch 265 can be placed adjacent a lower surface of a body region (e.g., region 31 described in FIG. 8). In one embodiment notch 265 has a v-shape in a cross-sectional view. It is understood that notches 265 can be other shapes including rounded or angular shapes or other shapes as known to those of ordinary skill in the art.

In some embodiments, the shape and placement of notch 265 can be modified by the thickness of layer 264 and/or the process used to form layer 264. For example, a thicker layer 264 can increase the width of trenches 222 compared to trenches 221 and can make the shape of notch 265 non-uniform (i.e., the side adjoining layer 264 can be longer than the side adjoining layer 261). It has been observed experimentally that it is preferred in some embodiments for the sides of notch 265 to be substantially of equal length. In some embodiments, trench structures 22 have a first width proximate to major surface 18 and a second width in a lower portion of the trenches 222 where the first width and the second width are substantially equal.

Figure 6:
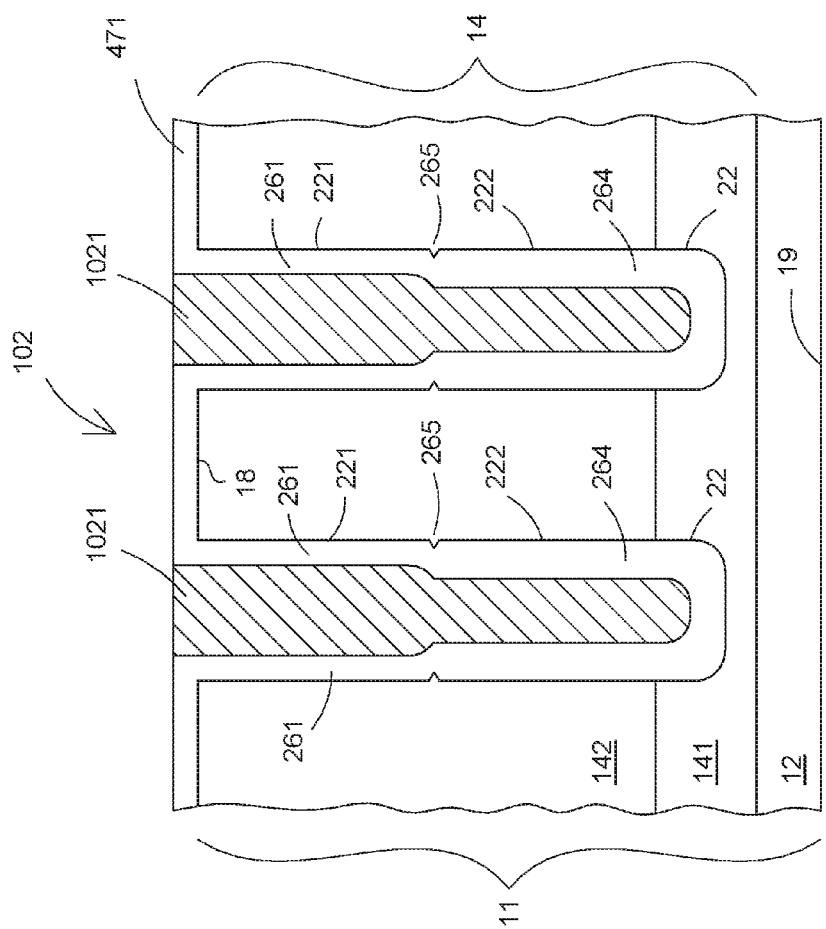

In one embodiment, layers 262 and 472 can then be removed using a wet etch process such as, a phosphoric acid etch process. In some embodiments, a layer of material can be formed overlying major surface 18 and within trench structures 22 along layers 261 and 264. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. In a subsequent step, the layer of material can be planarized to form intermediate structures 1021 within trench structures 22 as generally illustrated in FIG. 6. In one embodiment, chemical mechanical planarization (CMP) techniques can be used for the planarization step. When the layer of material includes crystalline semiconductor material, the layer of material can be heat treated before or after planarization to anneal, activate and/or diffuse any dopant material present in the crystalline semiconductor material.

Figure 7:
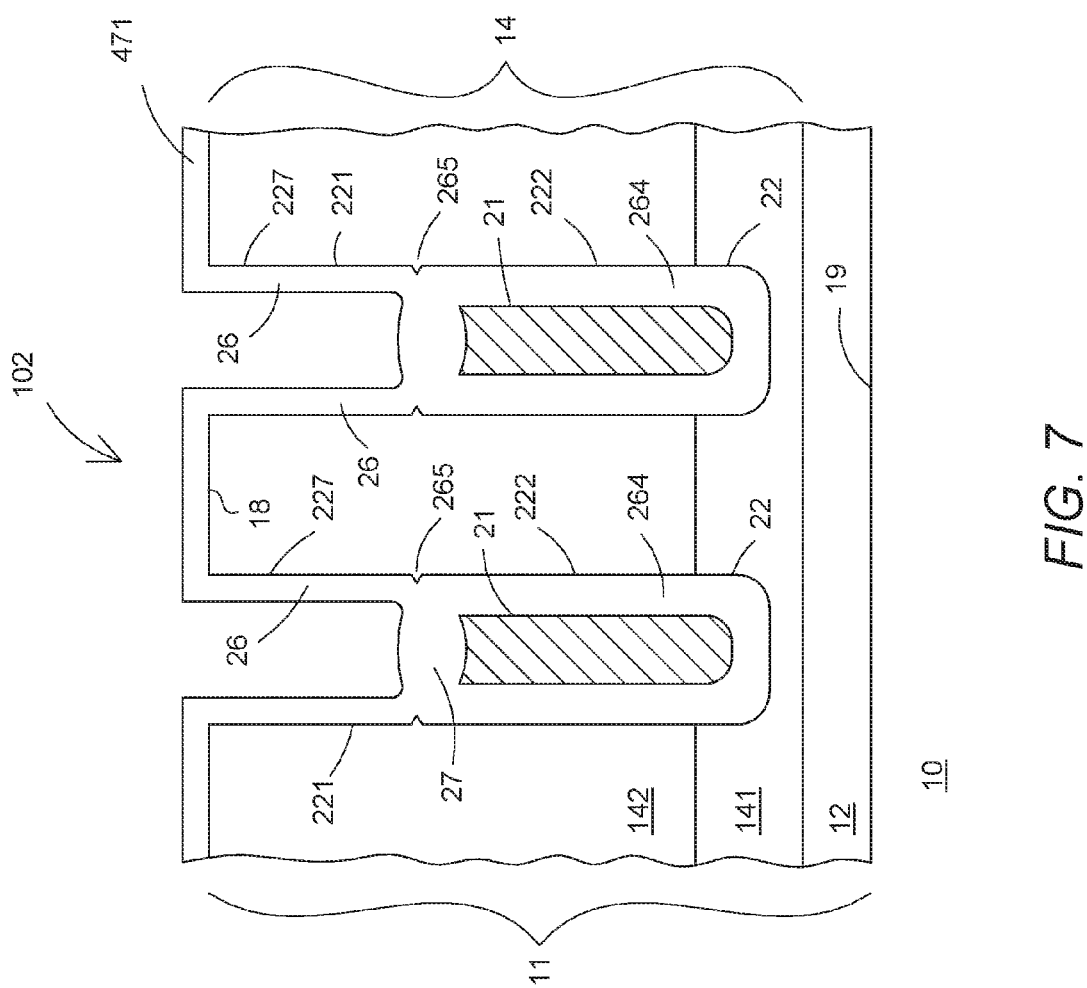

FIG. 7 illustrates a partial cross-sectional view of device 10 after additional processing. For example, intermediate structures 1021 can be further recessed within trench structures 22 to form shield electrodes 21. As an example, a dry etch with a fluorine or chlorine based chemistry can be used for the recess step when shield electrodes 21 include a crystalline semiconductor material. In accordance with the present embodiment, shield electrodes 21 are recessed within trenches 222. In other embodiments, shield electrodes 21 are recessed within trenches 221 as will be described later.

In one embodiment, portions of layer 471 and upper or exposed portions of layer 261 can be removed in a subsequent step. In another embodiment, upper or exposed portions of layer 261 or portions thereof and portions of layer 471 can be left in place. In some embodiments, layer 471 can be removed and all or a portion of layer 261 can be left in place, and a dielectric layer can then be formed along upper sidewall portions 227 of trench structures 22. In one embodiment, the dielectric layer can also be formed overlying shield electrode 21. The dielectric layer (together with any underlying layer(s)) forms gate layers or gate dielectric layers 26 along upper sidewall surfaces 227 of trenches 22 and inter-electrode dielectric layers 27 overlying shield electrodes 21. Gate layer 26 and inter-electrode dielectric layer 27 can be oxides, nitrides, tantalum pentoxide, titanium dioxide, barium strontium titanate, high k dielectric materials, combinations thereof, or other related or equivalent materials known by one of ordinary skill in the art. In one embodiment, gate layer 26 and inter-electrode dielectric layer 27 can be silicon oxide. In one embodiment, gate layer 26 can have a thickness from about 0.04 microns to about 0.1 microns, and inter-electrode dielectric layer 27 can have a thickness that is greater than that of gate layers 26. In some embodiments, layer 264 can have a greater thickness than gate layer 26 and inter-electrode dielectric layer 27.

Figure 8:
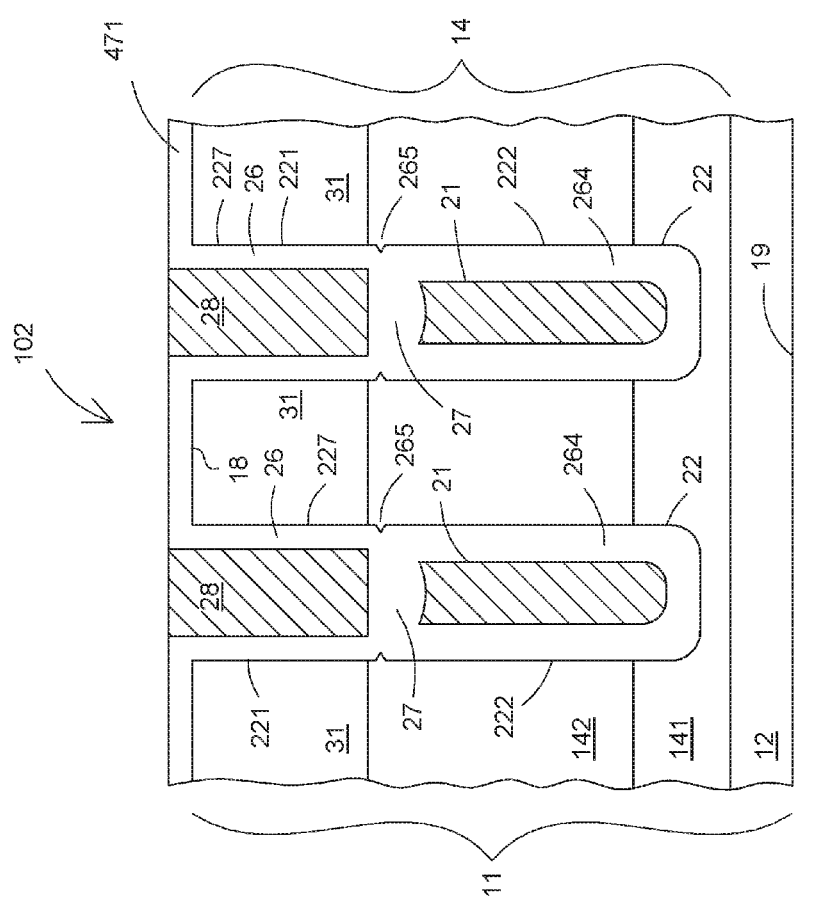

FIG. 8 illustrates a partial cross-sectional view of device 10 after further processing. A layer of material can be formed overlying major surface 18 and within trench structures 22. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. Subsequently, the layer of material can be planarized using dielectric layer 471 as a stop layer. In one embodiment, a CMP process can be used for the planarization step. The planarization step can be used to form gate electrodes 28 within trench structures 22 as illustrated in FIG. 8.

In one embodiment, body, base, or doped regions 31 can be formed extending from major surface 18 adjacent trench structures 22 into multi-region semiconductor layer 14. Body regions 31 can have a conductivity type that is opposite to that of multi-region semiconductor layer 14. In one embodiment, body regions 31 can have p-type conductivity and can be formed using, for example, a boron dopant source. Body regions 31 have a dopant concentration suitable for forming inversion layers that operate as conduction channels or channel regions 45 (illustrated, for example, in FIG. 10) of device 10. Body regions 31 can extend from major surface 18 to a depth, for example, from about 0.7 microns to about 1.0 microns. In some embodiments, body regions 31 can extend from major surface 18 to a depth proximate to notches 265. It was observed that notches 265 can be used to reduce electric field build-up near the edges of the junction between body regions 31 and charge balance region 142, which helps $BV_{DSS}$ and UIS performance in device 10. In other embodiments, body regions 31 are placed within multi-region semiconductor layer 14 so that notches 265 are placed proximate to a predetermined location where electric field reduction or control is preferred. In one embodiment, notches 265 are below the doping transition from body region 31 to multi-region semiconductor layer 14 as observed by spreading resistance probe or other procedures as known to those of ordinary skill in the art. In one embodiment, the doping transition from body regions 31 to multi-region semiconductor layer 14 is above notches 265 as illustrated in FIG. 8. In a preferred embodiment, the lower portion of body region 31 is about 0.1 microns to about 0.2 microns above notch 265. It is understood that body regions 31 can be formed at an earlier stage of fabrication, for example, before trenches 22 are formed. Body regions 31 can be formed using doping techniques, such as ion implantation and anneal techniques.

Figure 9:
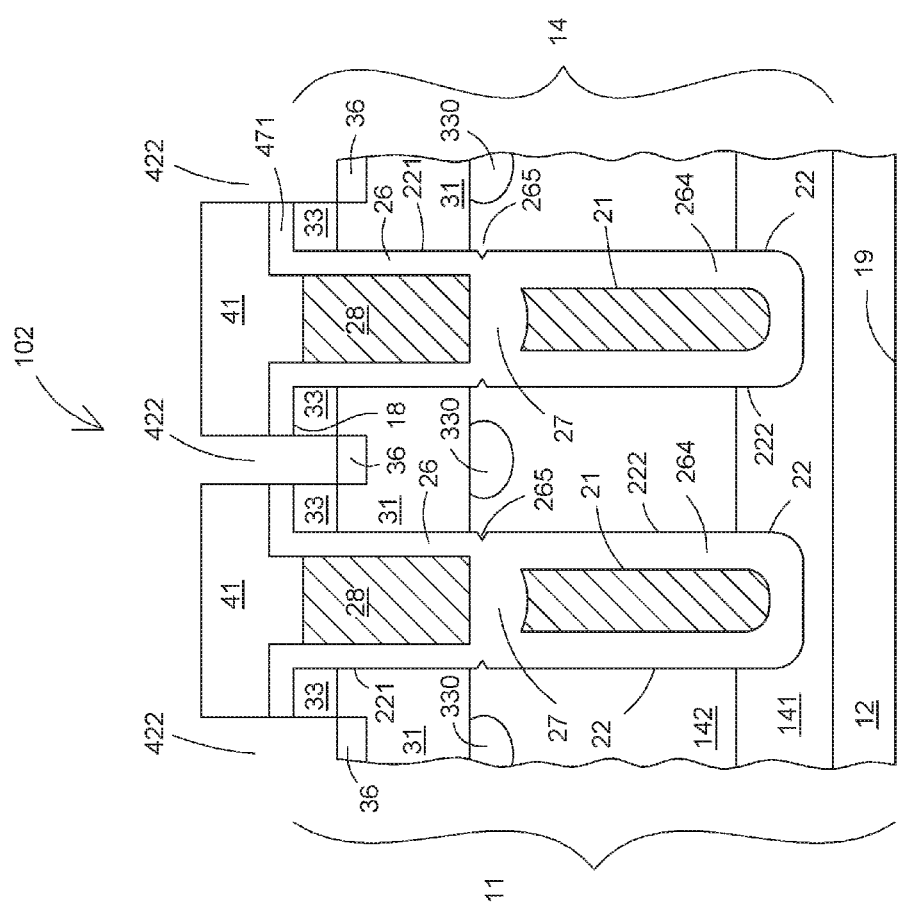

FIG. 9 illustrates a partial cross-sectional view of device 10 after additional processing. In a subsequent step, a masking layer (not shown) can be formed overlying portions of major surface 18. In one embodiment, source regions, current conducting regions, or current carrying regions 33 can be formed within, in, or overlying body regions 31 and can extend from major surface 18 to a depth for example, from about 0.2 microns to about 0.4 microns. In one embodiment, source regions 33 can have n-type conductivity and can be formed using, for example, a phosphorous or arsenic dopant source. In one embodiment, an ion implant doping process can be used to form source regions 33 within body regions 31. The masking layer can then be removed, and the implanted dopant can be annealed.

In one embodiment, gate electrodes 28 can be recessed below major surface 18 as generally illustrated in FIG. 9. In one embodiment, about 0.15 microns to about 0.25 microns of material can be removed as a result of the recessing step. The upper surface of gate electrodes 28 can be substantially flat or can have convex or concave shapes in a cross-sectional view. In one embodiment, a layer or layers 41 can be formed overlying major surface 18. In one embodiment, layers 41 comprise one or more dielectric or insulative layers and can be configured as an inter-layer dielectric (ILD) structure. In one embodiment, layers 41 can be silicon oxides, such as doped or undoped deposited silicon oxides. In one embodiment, layers 41 can include at least one layer of deposited silicon oxide doped with phosphorous or boron and phosphorous and at least one layer of undoped oxide. In one embodiment, layers 41 can have a thickness from about 0.4 microns to about 1.0 microns. In one embodiment, layers 41 can be planarized to provide a more uniform surface topography, which improves manufacturability.

Subsequently, a masking layer (not shown) can be formed overlying device 10, and openings, vias, or contact trenches 422 can be formed for making contact to source regions 33 and body regions 31, and for providing an opening for additional doping as will describe hereinafter. In one embodiment, a recess etch can be used to remove portions of source regions 33. The recess etch step can expose portions of body regions 31 below source regions 33. The masking layer can be subsequently removed. In accordance with the present embodiment, doped regions 330 can be formed in charge balance region 142 in proximity to the lower boundary of body regions 31. In some embodiments, doped regions 330 adjoin the lower boundary of body regions 31. In other embodiments, doped regions 330 overlap the lower boundary of body regions 31 and can be partially disposed within body regions 31 and partially disposed within charge balance region 142. In accordance with the present embodiment, doped regions 330 are configured to facilitate junction pinch-off at a reduced voltage in the region proximate to inter-electrode dielectric layers 27 and to lower the electric field near the junction between body regions 31 and charge balance region 142. It was observed that doped regions 330 can increase $BV_{DSS}$ and improve UIS performance without significantly impacting $R_{dson}$ or without significantly impeding drain current flow. Also, doped regions 330 were observed to reduce $Q_{gd}$ and improve $Q_{gd}/Q_{gs}$ ratio. In some embodiments, high energy ion implantation can be used to form doped regions 330 using an implant dosage selected so as to minimize any impact on the change balance in charge balance region 142 between adjacent pairs of trenches 22. In one embodiment, a boron ion implantation process can be used with an ion implant dose in a range from about $9.0\times10^{11}$ atoms/cm$^2$ to about $5.0\times10^{12}$ atoms/cm$^2$ and an implant energy of about 200 KeV to about 500 KeV. In another embodiment, an implant dose in a range from about $1.0\times10^{12}$ atoms/cm$^2$ to about $2.0\times10^{12}$ atoms/cm$^2$ and an implant energy of about 300 KeV to about 400 KeV can be used for doped region 330. Additionally, a p-type body contact, enhancement region, or contact region 36 can be formed in body regions 31, which can be configured to provide a lower contact resistance to body regions 31. Ion implantation (for example, using boron) and anneal techniques can be used to form contact regions 36. In some embodiments, body contact region 36 is spaced apart from doped regions 330 with a portion of body regions 31 in between.

Figure 10:
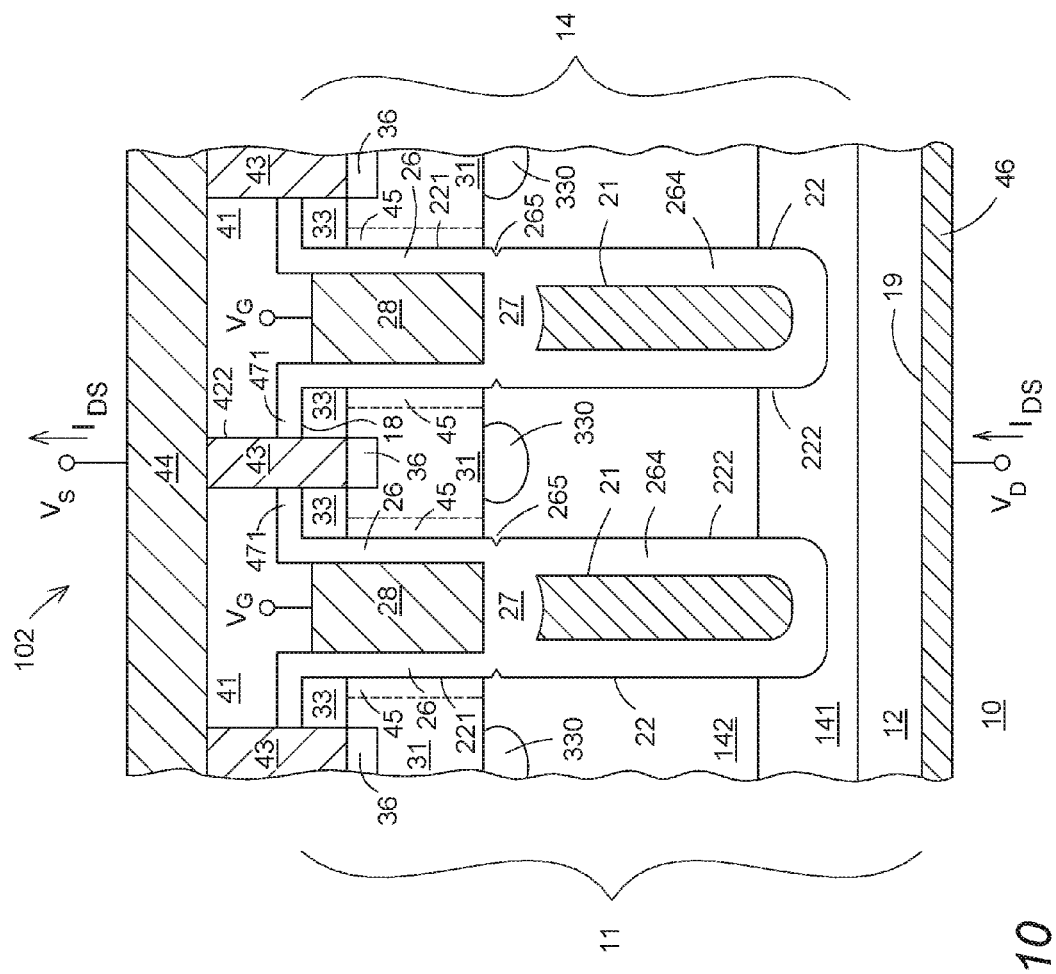

FIG. 10 illustrates a partial cross-sectional view of device 10 after still further processing. In one embodiment, conductive regions 43 can be formed in contact trenches 422 and configured to provide electrical contact to source regions 33 and body regions 31 through contact regions 36. It is understood that contact to gate electrodes 28 and shield electrodes 21 can be made in a peripheral portion of device 10 using, for example, trench contact structures. In one embodiment, conductive regions 43 can be conductive plugs or plug structures. In one embodiment, conductive regions 43 can include a conductive barrier structure or liner and a conductive fill material. In one embodiment, the barrier structure can include a metal/metal-nitride configuration, such as titanium/titanium-nitride or other related or equivalent materials as known by one of ordinary skill in the art. In another embodiment, the barrier structure can further include a metal-silicide structure. In one embodiment, the conductive fill material includes tungsten. In one embodiment, conductive regions 43 can be planarized to provide a more uniform surface topography.

A conductive layer 44 can be formed overlying major surface 18, and a conductive layer 46 can be formed overlying major surface 19. Conductive layers 44 and 46 can be configured to provide electrical connection between the individual device components of device 10 and a next level of assembly. In one embodiment, conductive layer 44 can be titanium/titanium-nitride/aluminum-copper or other related or equivalent materials known by one of ordinary skill in the art and is configured as a source electrode or terminal. In one embodiment, conductive layer 46 can be a solderable metal structure such as titanium-nickel-silver, chromium-nickel-gold, or other related or equivalent materials known by one of ordinary skill in the art and is configured as a drain electrode or terminal. In one embodiment, a further passivation layer (not shown) can be formed overlying conductive layer 44. In one embodiment, all or a portion of shield electrodes 21 can be connected (for example, using peripheral contact structures) to conductive layer 44, so that shield electrodes 21 are configured to be at the same potential as source regions 33 when device 10 is in use. In another embodiment, shield electrodes 21 can be configured to be independently biased or coupled in part to gate electrodes 28.

In one embodiment, the operation of device 10 can proceed as follows. Assuming that source electrode (or input terminal) 44 and shield electrodes 21 are operating at a potential $V_S$ of zero volts, gate electrodes 28 would receive a control voltage $V_G$ of 10 volts, which is greater than the conduction threshold of device 10, and drain electrode (or output terminal) 46 would operate at a drain potential $V_D$ of less than 2.0 volts. The values of $V_G$ and $V_S$ would cause body region 31 to invert adjacent gate electrodes 28 to form channels 45, which would electrically connect source regions 33 to multi-region semiconductor layer 14. A device current $I_{DS}$ would flow from drain electrode 46 and would be routed through multi-region semiconductor layer 14, channels 45, and source regions 33 to source electrode 44. In one embodiment, $I_{DS}$ is on the order of 10.0 amperes. To switch device 10 to the off state, a control voltage $V_G$ that is less than the conduction threshold of device 10 would be applied to gate electrodes 28 (e.g., $V_G<1.0$ volts). Such a control voltage would remove channels 45 and $I_{DS}$ would no longer flow through device 10. In accordance with the present embodiment, the configuration of device 10 as described herein maintains $B_{VDSS}$ performance with shallower trench structures. In device 10, $B_{VDSS}$ performance is supported in part by the MOS structure using charge balance techniques and in part by the lighter doped junction blocking layer 141. Also, multi-region semiconductor layer 14 allows trench structures 22 to have a reduced depth compared to related devices, which reduces $C_{OSS}$. Additionally, the more heavily doped charge balance region 142 provides for a lower $R_{dson}$. In addition, doped regions 330 provide for a reduced electric field and improved BVDSS performance, provide for improved UIS performance, and provide for a lower $Q_{gd}$ and $Q_{gd}/Q_{gs}$ performance without significantly impeding drain current or significantly impacting $R_{dson}$. Moreover, notches 265 provide for a reduced electric field near the edges of the junction between body regions 31 and charge balance region 142, which improves $B_{VDSS}$ performance In accordance with the present embodiment, device 10 was compared to a related device. In the comparison, device 10 exhibited a 1V to 2V higher $B_{VDSS}$ and exhibited about a 17% lower $Q_{gd}$. In the case of very narrow conductive regions 43, device 10 with doped region 330 still demonstrates robust UIS performance As a comparison, most similar devices without doped region 330 exhibit a severely degraded UIS in this unfavorable condition.

Figure 11:
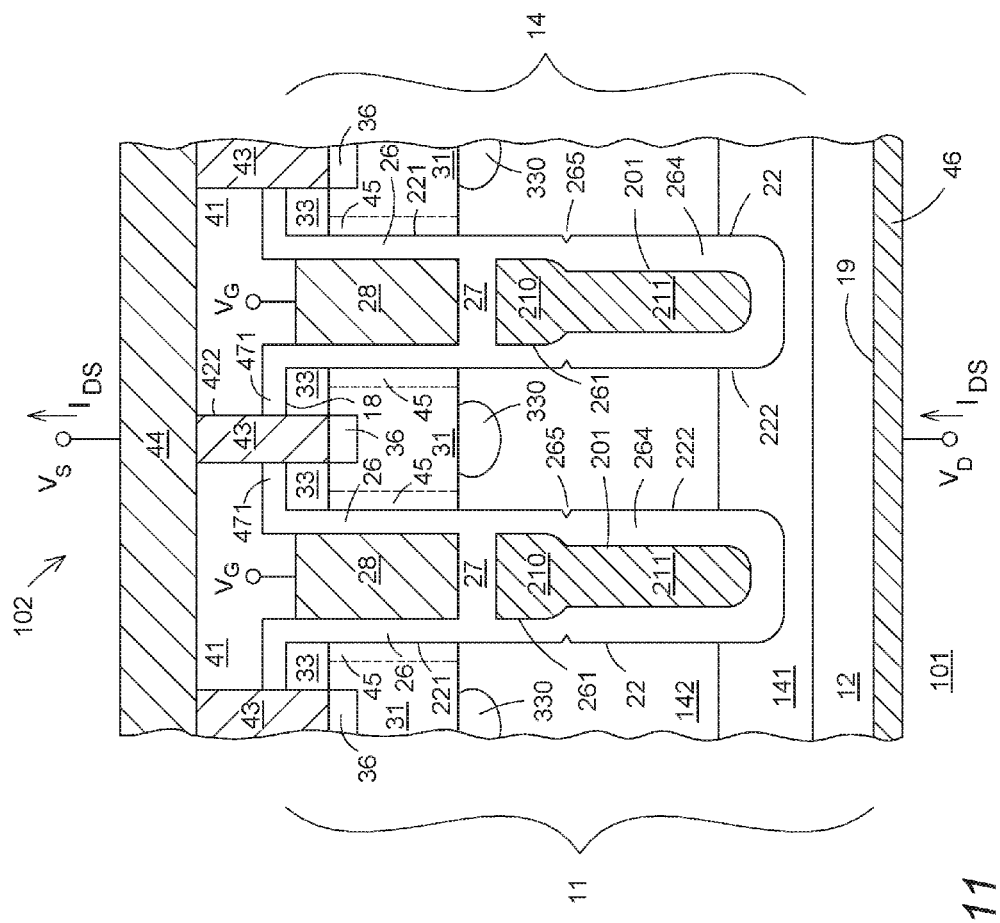
FIG. 11 illustrates a partial cross-sectional view of a semiconductor device in accordance with another embodiment of the present invention.

FIG. 11 illustrates an enlarged partial cross-sectional view of a semiconductor device 101 or cell 101 in accordance with another embodiment. Device 101 is similar to device 10 and only the differences between the two devices will be described. In accordance with this embodiment, device 101 includes a shield electrode 201 having a wide portion 210 adjoining a narrow portion 211. Wide portion 210 can be separated from charge balance region 142 by dielectric layer 261 described in conjunction with FIG. 2; and narrow portion 211 can be separated from charge balance region 142 and junction blocking region 142 by layer 264 described in conjunction with FIG. 5. As illustrated in FIG. 11, in one embodiment shield electrode 201 can have a hammer-like shape in cross-sectional view. In one embodiment, shield electrode 201 can be formed as follows. For example, in the process step described previously in conjunction with FIGS. 6 and 7, the amount of conductive material removed after intermediate structures 1021 are formed is reduced. This leaves a wide portion of the recessed material adjacent to dielectric layer 261 to provide portion 210 of shield electrode 201, and to provide narrow portion 211 adjacent dielectric layer 264. In some embodiments of device 101, doped regions 330 are included. In a preferred embodiment, wide portion 210 can be 50% of the total thickness or height of shield electrode 201 and narrow portion 211 can be the remaining 50% of the total thickness or height of shield electrode 201. In other embodiments, wide portion 201 is less than 50% of the total thickness or height of shield electrode 201 and narrow portion 211 is greater than 50% of the total thickness or height of shield electrode 201. In still other embodiments, wide portion 201 is greater than 50% of the total thickness or height of shield electrode 201 and narrow portion 211 is less than 50% of the total thickness or height of shield electrode 201

In accordance with this embodiment, device 101 having shield electrode 201 was observed experimentally to have several advantages over prior devices. For example, the structure of device 101 was observed to help pinch-off in the junction area formed by body region 31 and charge balance region 142 at lower voltages compared to related devices. Also, in accordance with the present embodiment, shield electrodes 201, which have wider portions 210 and thinner dielectric layers 261 adjacent the drift region below body region 31, are configured to help deplete the area between the body region 31-charge balance region 142 junction faster to move the peak electric field (for example, under avalanche conditions) away from the junction edge, which helps improve UIS performance and maintain $BV_{DSS}$ performance with doped regions 330. Also, in accordance with the present embodiment, the configuration of shield electrodes 201 helps provide an improved RESURF effect close to the body region 31-charge balance region 142 junction to help lower on-resistance while maintaining $BV_{DSS}$. In addition, thicker dielectric layers 264 are configured to help increase breakdown voltage.

Figure 12:
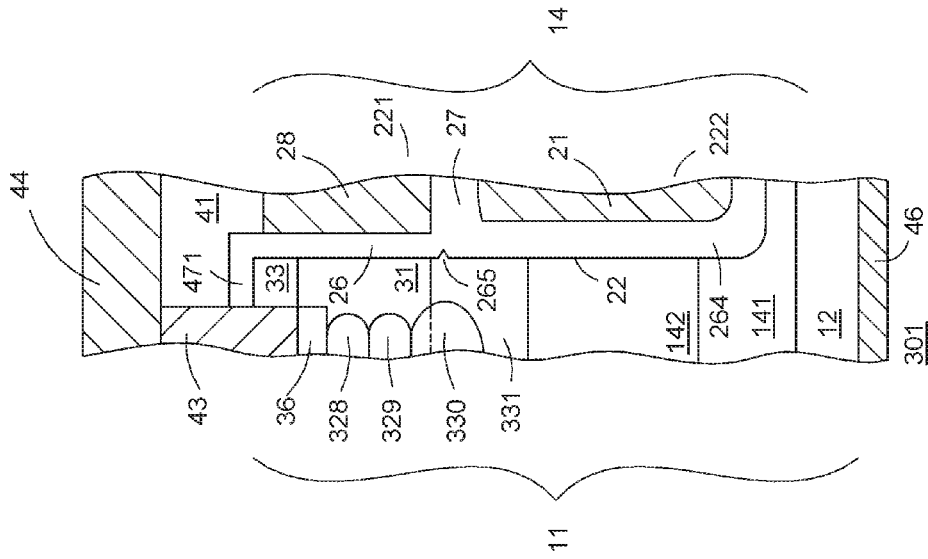
FIG. 12 illustrates a partial cross-sectional view of a semiconductor device in accordance with an additional embodiment of the present invention.

FIG. 12 illustrates a partial cross-sectional view of a semiconductor device 201 or cell 201 in accordance with a further embodiment. Device 201 is similar to devices 10 and 101 and only the differences between the devices will be described. In device 201, the profile in cross-sectional view of sidewall 2271 tapers inward as trench 221 extends downward from major surface 18 towards notch 265. Also, in some embodiments, the profile of at least a portion of sidewall 2221 in cross-sectional view is substantially perpendicular to major surface 18 as trench 222 extends downward from notch 265 towards substrate 12. Additionally, in device 201 doped region 330 is spaced apart from body region 31 so that a portion of charge balance region 142 is between doped region 330 and body region 31.

Figure 13:
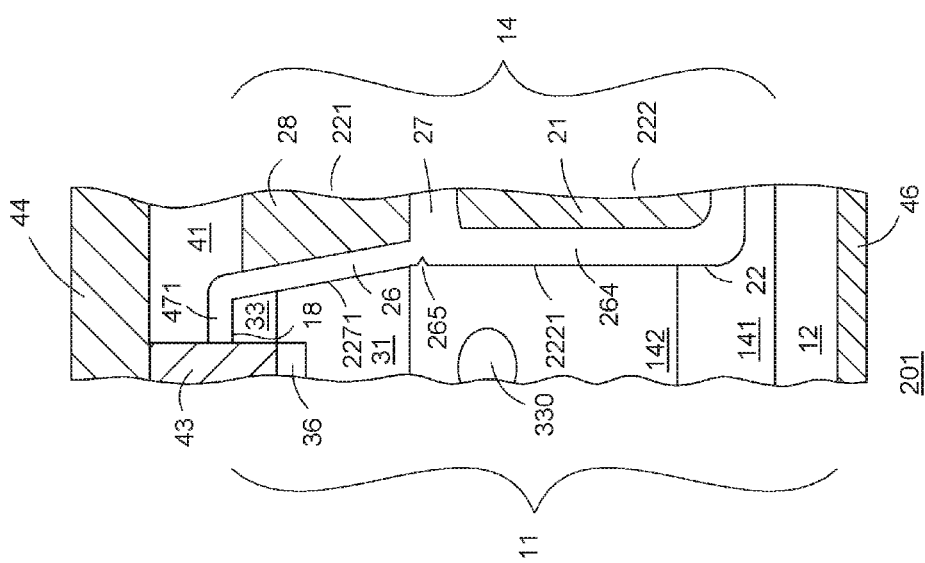
FIG. 13 illustrates a partial cross-sectional view of a semiconductor device in accordance with a further embodiment of the present invention.

FIG. 13 illustrates a partial cross-section view of a semiconductor device 301 or cell 301 in accordance with a still further embodiment. Device 301 is similar to devices 10 and 101 and only the difference between the devices will be described. In some embodiments, device 301 includes multiple doped regions within body region 31, such as doped region 328 adjacent enhancement region 36, one or more doped regions 329 adjacent doped region 328, and doped region 330 adjacent the one or more doped regions 329. In one embodiment, doped region 330 overlaps body region 31 and charge balance region 142 so that doped region 330 is in both of these regions. In one embodiment, doped region 330 extends below body region 31 into charge balance region 142. In some embodiments, doped region 330 is partially within the body region 31 and partially within the charge balance region 142. In one embodiment, enhancement region 36, doped region 328, one or more doped regions 329, and doped region 330 adjoin each other. In some embodiments, doped region 328, one or more doped regions 329, and doped region 330 can be formed using multiple ion implants using different ion implant energies. In one embodiment, doped region 328 and doped region 329 can be formed using boron ion implantation with an ion implant dosage in a range from about $1.0 \times 10^{12}$ atoms/cm$^2$ to about $2.0 \times 10^{12}$ atoms/cm$^2$ for each implant. In one embodiment, an ion implant energy of about 90 KeV to 120 KeV can be used for doped region 328 and an ion implant energy of about 200 KeV to 240 KeV can be used for doped region 329. It is understood that additional implants with different energies can be used for additional doped regions between doped region 328 and doped region 330. For example, in another embodiment, a six-implant (about 60 KeV, 120 KeV, 180 KeV, 240 KeV, 300 KeV, 360 KeV, with $0.5 \times 10^{12}$ atoms/cm$^2$ to $1.0 \times 10^{12}$ atoms/cm$^2$ for each implant) can be used. Device 301 is configured to enhance the UIS ruggedness by, among other things, assuring a higher current conductive path during an UIS event.

Device 301 can further include another doped region 331 formed in charge balance region 241 adjacent to body region 31. In some embodiments, doped region 331 has a higher dopant concentration than charge balance region 142 and is configured to help reduce $R_{dson}$. In some embodiments, a high energy ion implantation can be used to form doped regions 331. In some embodiments, doped region 331 have the same conductivity type as charge balance region 142 and an opposite conductivity type to doped region 330. In one embodiment, a phosphorous ion implantation can be used with an ion implant dose of about $2.0 \times 10^{12}$ atoms/cm$^2$ and an implant energy of about 1 MeV. In one embodiment, doped region 331 can be formed using an implant energy in the range from about 1 MeV to about 3 MeV. In an alternative embodiment, doped region 331 can be formed using epitaxial growth techniques while forming charge balance region 142. In some embodiments, doped region 331 extends deeper into charge balance region 142 than doped region 330. In other embodiments, doped region 331 preferably has a dopant concentration higher than charge balance region 142. In one embodiment, doped region 331 laterally extends between at least a portion of doped region 330 and trench structures 22. It is understood that doped region 331 can be used with devices 10, 101, and/or 201.

From all of the foregoing, one skilled in the art can determine that, according to one embodiment, an insulated gate semiconductor device structure (for example, elements 10, 101, 201) comprises a region of semiconductor material (for example, element 11) including a semiconductor substrate (for example, element 12), a first semiconductor layer of a first conductivity type (for example, element 141) and a first dopant concentration on the semiconductor substrate, and a second semiconductor layer (for example, element 142) on the first semiconductor layer, the second semiconductor layer having the first conductivity type, having a second dopant concentration greater than the first dopant concentration, and having a major surface (for example, element 18). The structure includes a body region (for example, element 31) of a second conductivity type in the second semiconductor layer extending from the major surface. The structure includes a trench structure (for example, element 22) in the first semiconductor layer and the second semiconductor layer extending from the major surface adjacent the body region. The trench structure comprises a trench (for example elements 221, 222) terminating with the first semiconductor layer (for example, element 141), an insulated gate electrode (for example, element 28) and an insulated shield electrode (for example, element 21, 201) below the insulated gate electrode. A source region (for example, element 33) of the first conductivity type in the body region is adjacent the trench structure. A doped region (for example, element 330) of the second conductivity type is in the second semiconductor layer adjacent a lower surface of the body region, wherein a portion of the second semiconductor layer separates the doped region from the trench structure.

In another embodiment, the structure further includes a first doped region (for example, element 330) of the second conductivity type in the second semiconductor layer adjacent a lower surface of the body region, wherein a portion of the second semiconductor layer separates the first doped region from the trench structure. In a further embodiment, the first doped region adjoins the lower surface of the body region. In another embodiment, the first doped region adjoins the lower surface of the body region. In a further embodiment, the first doped region is in the semiconductor layer and spaced apart from the body region. In another embodiment, the structure further includes a plurality of second doped regions (for example, elements 328, 329) between the first doped region and the major surface and spaced apart from the trench such that the plurality of second doped regions and the doped region are substantially vertically aligned. In a further embodiment, the first doped region is partially with the body region and partially within the second semiconductor layer. In another embodiment, the shield electrode comprises a first portion (for example, element 210) and a second portion (for example, element 211), wherein the first portion is wider than the second portion, and wherein the first portion is between the insulated gate electrode and the second portion. In a further embodiment, the trench structure comprises a sidewall profile having a notch (for example, element 265) oriented substantially inward towards an inner portion of the trench and adjacent the lower surface of the body region. In another embodiment, the lower surface of the body region is above the notch. In a further embodiment, the sidewall profile (for example, element 2271) is substantially perpendicular to the major surface as the trench extends downward from the notch towards a lower surface of the trench. In another embodiment, the trench has a first width proximate to the major surface and a second width in a lower portion of the trench adjacent the insulated shield electrode, wherein the first width and the second width are substantially equal. In a still further embodiment, the structure can further include a second doped region of the first conductivity type in the second semiconductor layer adjacent the first doped region and adjacent the trench structure. In a further embodiment, the second doped region has a higher dopant concentration than the second semiconductor layer. In yet another embodiment, the doped region is within the second doped region. In another embodiment, the second doped region extends further into the second semiconductor layer than the doped region.

Those skilled in the art will also appreciate that, according to another embodiment, an insulated gate semiconductor device structure (for example, elements 10, 101, 201) comprises a region of semiconductor material (for example, element 11) including a semiconductor substrate (for example, element 12), a first semiconductor layer of a first conductivity type and a first dopant concentration (for example, element 141) on the semiconductor substrate, and a second semiconductor layer on the first semiconductor layer, the second semiconductor layer having the first conductivity type, having a second dopant concentration greater than the first dopant concentration (for example, element 142), and having a major surface (for example, element 18). The structure includes a body region (for example, element 31) of a second conductivity type in the second semiconductor layer extending from the major surface. The structure includes a trench structure (for example, element 22) in the first semiconductor layer and the second semiconductor layer extending from the major surface adjacent the body region, and wherein the trench structure comprises a trench (for example, element 221, 222), an insulated gate electrode (for example, element 26, 28), and an insulated shield electrode (for example, element 21, 201, 261, 264) below the insulated gate electrode. The structure includes a source region of the first conductivity type (for example, element 33) in the body region adjacent the trench structure, wherein the trench structure comprises a sidewall profile having a notch (for example, element 265) oriented substantially inward towards an inner portion of the trench and adjacent the lower surface of the body region.

In another embodiment of the structure, the trench structure terminates within the first semiconductor layer. In further embodiment, the shield electrode (for example, element 201) comprises a first portion (for example, element 210) and a second portion (for example, element 211), wherein the first portion is wider than the second portion. In another embodiment, the structure further comprises a doped region of the second conductivity in the second semiconductor layer adjacent a lower surface of the body region, wherein a portion of the second semiconductor layer separates the doped region from the trench structure. In a further embodiment, the doped region adjoins the lower surface of the body region. In another embodiment, the sidewall profile (for example, element 2271) tapers inward as the trench extends downward from the major surface towards the notch. In a still further embodiment, the sidewall profile (for example, element 2221) is substantially perpendicular to the major surface as the trench extends downward from the notch towards a lower surface of the trench.

Those skilled in the art will also appreciate that, according to a still further embodiment, an insulated gate semiconductor device structure (for example, elements 10, 101, 201) comprises a region of semiconductor material (for example, element 11) including a semiconductor substrate (for example, element 11), a first semiconductor layer (for example, element 141) of a first conductivity type and a first dopant concentration on the semiconductor substrate, and a second semiconductor layer (for example, element 142) on the first semiconductor layer, the second semiconductor layer having the first conductivity type, having a second dopant concentration greater than the first dopant concentration, and having a major surface (for example, element 18). The structure includes a body region (for example, element 31) of a second conductivity type in the second semiconductor layer extending from the major surface. The structure includes a trench structure (for example, element 22) in the first semiconductor layer and the second semiconductor layer extending from the major surface adjacent the body region, the trench structure including a trench (for example, elements 221, 222), an insulated gate electrode (for example, element 28), and an insulated shield electrode (for example, element 201) below the insulated gate electrode, wherein the shield electrode comprises a first portion (for example, element 210) and a second portion (for example, element 211), wherein the first portion is wider than the second portion. The structure includes a source region (for example, element 33) of the first conductivity type in the body region adjacent the trench structure and a doped region (for example, element 330) of the second conductivity type in the second semiconductor layer adjacent a lower surface of the body region, wherein a portion of the second semiconductor layer separates the doped region from the trench structure.

In another embodiment, the trench structure comprises a notch (for example, element 265) oriented substantially inward towards an inner portion of the trench and adjacent the lower surface of the body region, and wherein the doped region adjoins the lower surface of the body region. In a further embodiment, the second dopant concentration is at least 90% greater than the first dopant concentration. In another embodiment, the second dopant concentration is about 150% to about 750% greater than the first dopant concentration.

Those skilled in the art will also appreciate that, according to another embodiment, a method for forming an insulated gate semiconductor device (for example, elements 10, 101, 201) includes providing a semiconductor region (for example, element 11) having a semiconductor substrate (for example, element 12), a first semiconductor layer of a first conductivity type and a first dopant concentration (for example, element 141) on the semiconductor substrate, a second semiconductor layer on the first semiconductor layer, the second semiconductor layer having the first conductivity type, having a second dopant concentration greater than the first dopant concentration (for example, element 142), and having a major surface (for example, element 18). The method includes forming a trench structure (for example, element 22) formed in the first semiconductor layer and the second semiconductor layer extending from the major surface adjacent the body region, and wherein the trench structure comprises a trench (for example, element 221, 222), an insulated gate electrode (for example, element 26, 28), and an insulated shield electrode (for example, element 21, 201, 261, 264) adjacent the insulated gate electrode. The method includes forming a body region of a second conductivity type (for example, element 31) in the second semiconductor layer extending from the major surface. The method includes forming a source region of the first conductivity type (for example, element 33) in the body region adjacent the trench structure and forming a doped region of the second conductivity type (for example, element 330) in the second semiconductor layer adjacent a lower surface of the body region, wherein a portion of the second semiconductor layer separates the doped region from the trench structure.

In another embodiment, forming the trench structure comprises forming a shield electrode (for example, element 201) comprising a first portion (for example, element 210) and a second portion (for example, element 211), wherein the first portion is wider than the second portion. In a further embodiment, forming the trench structure comprises forming the trench a having a notch (for example, element 265) in a sidewall oriented substantially inward towards an inner portion of the trench, and wherein forming the body region comprises placing the lower surface of the body region proximate to the notch.

In view of all the above, it is evident that a novel method and structure are disclosed. Included, among other features, is a semiconductor substrate, a junction blocking layer of a first dopant concentration on the semiconductor substrate, and a charge balance region of a second dopant concentration on the junction blocking layer. Preferably, the second dopant concentration is greater than the first dopant concentration, which provides for a reduction in trench structure depth to improve $C_{OSS}$ performance while achieving low $R_{dson}$. In one embodiment, the device includes a trench structure having an insulated shield electrode and an insulated gate electrode where the side profile of the trench structure includes a notch or channel proximate to a body region of the device. The notch can be configured to reduce electric field build-up and increase $BV_{DSS}$ performance In one embodiment, the device includes a localized doped region adjacent a lower surface of the body region but spaced apart from the trench structure. The doped region has an opposite conductivity type to the charge balance region and can be configured to enhance UIS performance, reduce electric-field build-up and increase $BV_{DSS}$ performance, and lower capacitance. In another embodiment, the shield electrode has a wide portion and a narrow portion configured to lower $R_{dson}$, improve $BV_{DSS}$ and UIS performance, and reduce capacitance. In a further embodiment the device can include a doped region having the same conductivity type as the charge balance region adjacent the body region and the trench structure. The doped region can have a higher doping concentration that the charge balance region and can be configured to help reduce $R_{DSON}$. In one embodiment, the device can include all of the above described features. In another embodiment, the device can include at least one of the described features. In a further embodiment, the device can include at least two of the described features. In a further embodiment, the device can include at least three of the described features. In a still further embodiment, the device can include at least four of the described features.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors, as wells as bipolar, BiCMOS, metal semiconductor FETs (MESFETs), HFETs, thyristors bi-directional transistors, and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments, as would be understood by those skilled in the art.

What is claimed is:

1. A method for forming an insulated gate semiconductor device comprising:
    providing a semiconductor region comprising:
        a semiconductor substrate;

a first semiconductor layer of a first conductivity type and a first dopant concentration on the semiconductor substrate, and
a second semiconductor layer on the first semiconductor layer, the second semiconductor layer having the first conductivity type, having a second dopant concentration greater than the first dopant concentration;
forming a trench structure disposed in the first semiconductor layer and the second semiconductor layer extending from the major surface, wherein the trench structure comprises:
a trench;
an insulated gate electrode; and
an insulated shield electrode adjacent the insulated gate electrode;
forming a body region of a second conductivity type in the second semiconductor layer extending from the major surface, wherein the trench structure is adjacent the body region;
forming a source region of the first conductivity type in the body region adjacent the trench structure; and
forming a doped region of the second conductivity type in the second semiconductor layer adjacent a lower surface of the body region, wherein a portion of the second semiconductor layer separates the doped region from the trench structure and another portion of the second semiconductor layer separates the doped region from the first semiconductor layer.

2. The method of claim 1, wherein forming the trench structure comprises:
forming a shield electrode comprising a first portion and a second portion, wherein the first portion is wider than the second portion.

3. The method of claim 1, wherein forming the trench structure comprises:
forming the trench having a notch in a sidewall, wherein the notch is oriented substantially inward towards an inner portion of the trench.

4. The method of claim 3, wherein forming the body region comprises disposing a lower surface of the body region and the notch proximate to each other.

5. The method of claim 1, wherein providing the semiconductor region comprises providing the second dopant concentration at least 90% greater than the first dopant concentration.

6. The method of claim 1, wherein providing the semiconductor region comprises providing the second dopant concentration in a range from about 150% to about 750% greater than the first dopant concentration.

7. A method for forming an insulated gate semiconductor device comprising:
providing a region of semiconductor material comprising:
a semiconductor substrate;
a first semiconductor layer of a first conductivity type and a first dopant concentration on the semiconductor substrate; and
a second semiconductor layer on the first semiconductor layer, the second semiconductor layer having the first conductivity type, having a second dopant concentration greater than the first dopant concentration, and having a major surface;
forming a first trench structure in the first semiconductor layer and the second semiconductor layer extending from the major surface, and wherein the first trench structure comprises:
a first trench terminating within the first semiconductor layer;
a first insulated gate electrode; and
a first insulated shield electrode below the first insulated gate electrode;
forming a second trench structure in the first semiconductor layer and the second semiconductor layer extending from the major surface, wherein the second trench structure and the first trench structure are laterally spaced apart, and wherein the second trench structure comprises:
a second trench terminating within the first semiconductor layer;
a second insulated gate electrode; and
a second insulated shield electrode below the second insulated gate electrode, wherein the second semiconductor layer is a continuous layer extending between the first trench and the second trench;
forming a body region of a second conductivity type in the second semiconductor layer extending from the major surface, wherein the body region is adjacent the first trench structure and adjacent the second trench structure;
forming a first source region of the first conductivity type in the body region adjacent the first trench structure; and
forming a second source region of the first conductivity type in the body region adjacent the second trench structure.

8. The method of claim 7, further comprising:
forming a first doped region of the second conductivity type in the second semiconductor layer adjacent a lower surface of the body region, wherein a portion of the second semiconductor layer separates the first doped region from the first trench structure, another portion of the second semiconductor layer separates the first doped region from the second trench structure, and a further portion of the second semiconductor layer separates the first doped region from the first semiconductor layer.

9. The method of claim 8 further comprising:
forming a plurality of second doped regions of the second conductivity type between the first doped region and the major surface and spaced apart from the first and second trench structures, wherein the first doped region is partially within the body region and partially within the second semiconductor layer.

10. The method of claim 7, wherein providing the region of semiconductor material comprises providing the second dopant concentration at least 90% greater than the first dopant concentration.

11. The method of claim 7, wherein providing the region of semiconductor material comprises providing the second dopant concentration in a range from about 150% to about 750% greater than the first dopant concentration.

12. The method of claim 7, wherein providing the region of semiconductor material comprises providing the second dopant concentration in a range from about 250% to about 700% greater than the first dopant concentration.

13. The method of claim 7, wherein providing the region of semiconductor material comprises:
providing the first dopant concentration in a range from about $5.0 \times 10^{15}$ atoms/cm$^3$ to about $1.0 \times 10^{16}$ atoms/cm$^3$; and
providing the second dopant concentration in a range from of about $2.0 \times 10^{16}$ atoms/cm$^3$ to about $4.0 \times 10^{16}$ atoms/cm$^3$.

14. The method of claim 7, wherein providing the region of semiconductor material comprises:

providing the first semiconductor layer having a thickness from about 4 microns to about 5 microns; and providing the second semiconductor layer having a thickness from about 3.5 microns to about 4.5 microns.

15. The method of claim 7, wherein forming first trench structure comprises forming the first trench having a sidewall profile with a notch oriented substantially inward towards an inner portion of the first trench, wherein the notch and a lower surface of the body region are adjacent.

16. A method for forming an insulated gate semiconductor device comprising:
providing a region of semiconductor material comprising a semiconductor substrate, a first semiconductor layer of a first conductivity type and a first dopant concentration adjacent the semiconductor substrate, and a second semiconductor layer adjacent the first semiconductor layer, the second semiconductor layer having the first conductivity type, having a second dopant concentration greater than the first dopant concentration, and having a major surface;
forming a trench structure having a trench structure first portion and a trench structure second portion in cross-sectional view, wherein the second semiconductor layer is a continuous layer extending between the trench structure first portion and the trench structure second portion in cross-sectional view, and wherein the trench structure comprises:
a trench extending from the major surface terminating within the first semiconductor layer;
an insulated gate electrode; and
an insulated shield electrode below the insulated gate electrode;
forming a body region of a second conductivity type in the second semiconductor layer extending from the major surface, wherein the body region is adjacent to the trench structure first portion and adjacent to the trench structure second portion; and
forming a source region of the first conductivity type in the body region, wherein the source region comprises a source region first portion adjacent the trench structure first portion and a source region second portion adjacent the trench structure second portion in cross-sectional view.

17. The method of claim 16, further comprising:
forming a first doped region of the second conductivity type in the second semiconductor layer adjacent a lower surface of the body region, wherein a portion of the second semiconductor layer separates the first doped region from the trench structure first portion, another portion of the second semiconductor layer separates the first doped region from the trench structure second portion, and a further portion of the second semiconductor layer separates the first doped region from the first semiconductor layer.

18. The method of claim 16, wherein providing the region of semiconductor material comprises providing the second dopant concentration at least 90% greater than the first dopant concentration.

19. The method of claim 16, wherein providing the region of semiconductor material comprises providing the second dopant concentration in a range from about 100% to about 800% greater than the first dopant concentration.

20. The method of claim 16, wherein providing the region of semiconductor material comprises:
providing the first dopant concentration in a range from about $5.0 \times 10^{15}$ atoms/cm$^3$ to about $1.0 \times 10^{16}$ atoms/cm$^3$; and
providing the second semiconductor layer having a dopant concentration in a range from of about $2.0 \times 10^{16}$ atoms/cm$^3$ to about $4.0 \times 10^{16}$ atoms/cm$^3$.

* * * * *